United States Patent
Mahajan et al.

(10) Patent No.: US 8,441,382 B2
(45) Date of Patent: May 14, 2013

(54) CURRENT STEERING DAC WITH SWITCHED CASCODE OUTPUT CURRENT SOURCE/SINK

(75) Inventors: Puneet Mahajan, Ghaziabad (IN); Anand Singh Rawat, Dwarka (IN); Anil Kumar, Greater Noida (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 115 days.

(21) Appl. No.: 13/047,542

(22) Filed: Mar. 14, 2011

(65) Prior Publication Data

US 2011/0221620 A1 Sep. 15, 2011

(30) Foreign Application Priority Data

Mar. 15, 2010 (IN) .............................. 600/DEL/2010
n

(51) Int. Cl.
*H03M 1/00* (2006.01)
(52) U.S. Cl.
USPC .............................. 341/136; 341/144; 341/121

(58) Field of Classification Search .................. 341/121, 341/136, 144
See application file for complete search history.

(56) References Cited

U.S. PATENT DOCUMENTS

| | | | |
|---|---|---|---|
| 5,548,288 A * | 8/1996 | Lueng ............................. | 341/136 |
| 6,967,609 B1 * | 11/2005 | Bicakci et al. ................. | 341/144 |
| 7,030,799 B2 * | 4/2006 | Lee et al. ....................... | 341/144 |
| 7,157,941 B2 * | 1/2007 | Koo ............................... | 326/121 |
| 7,307,568 B1 * | 12/2007 | Nhuyen et al. ................ | 341/144 |
| 2002/0044076 A1 * | 4/2002 | Yao et al. ....................... | 341/136 |
| 2006/0012501 A1 * | 1/2006 | Lee et al. ....................... | 341/144 |
| 2008/0198053 A1 * | 8/2008 | Tsang ............................ | 341/144 |
| 2009/0045993 A1 * | 2/2009 | Tokumaru et al. ............ | 341/136 |

* cited by examiner

*Primary Examiner* — Jean B Jeanglaude
(74) *Attorney, Agent, or Firm* — Allen, Dyer, Doppelt, Milbrath & Gilchrist, P.A.

(57) ABSTRACT

A current-steering digital-to-analog converter may include a plurality of current cells. Each current cell may comprise a dual bias switched cascode output current source/sink, a bias source, complementary bias switching elements coupled between the bias source and the bias inputs of the switched cascode output current source/sink, and complementary switching signals coupled to the control inputs of the complementary bias switching element.

27 Claims, 5 Drawing Sheets

CURRENT STEERING DAC WITH SWITCHED CASCODE OUTPUT CURRENT SOURCE/SINK

FIELD OF THE INVENTION

The present disclosure relates to digital-to-analog converters (DACs) and, more specifically, to current-steering DACs with a switched cascode output current source/sink.

BACKGROUND OF THE INVENTION

As the demands for video signal processing increase, there may be a desire for digital signal synthesis and high accuracy DACs at high clock frequencies and with wide dynamic ranges. Complementary metal-oxide-semiconductor (CMOS) current-steering DAC architectures may provide a desirable structure for most of these applications. The current-steering DAC may have the advantages of small resolution below 10 bits and being very fast. Another good property of the current-steering DAC may be high power efficiency since all power is directed to the output. The current-steering may be suitable for high speed, high resolution applications, especially when special care is taken to improve the device mismatching, glitches, and current source output impedance for high bit converters. The current sources may be typically implemented with cascaded NMOS or PMOS transistors.

FIG. 1 illustrates a typical current-steering DAC with current source. A current steering DAC includes a plurality of unit current cells 101 corresponding to the number of bits of a digital input signal, and a bias circuit for generating a bias voltage for adjusting current values of the unit current cells to a prescribed value. When a digital input signal is applied to the current steering DAC, the current steering DAC may select currents to be applied from the plurality of unit current cell and outputs the current through its respective switch. When the switch is "ON," the current flows through $R_{OUT}$ 102 and when it is "OFF," the current is bypassed to ground. Finally, the sum of the selected currents is sent out from the analog output terminal 102. The node 103 is the point where all the currents contributing to the output sum up to flow through $R_{OUT}$, and the node 104 is the point where all the current which is bypassed to ground adds up. A potential advantage with this architecture is that almost all the current passes through the output, making this architecture power efficient. Therefore, this type of converters may be better for high speed D/A converters.

FIG. 2 illustrates an internal architecture of a unit current cell of the current-steering DAC. M1 (PMOS transistor) acts as a current source, which is controlled by bias voltage (Vbias). Another bias source node_int provides a fixed current to the cascode inputs. M2 (PMOS transistor), M5 (MOS transistor), and M6 (NMOS transistor) are the part of a regulated cascode, which are basically used to reduce the drain-source voltage ($V_{ds}$) variation across the current source M1, so that the current and impedance variation may be minimized. M3 and M4 are the switches, which provide the path to the current either $R_{OUT}$ or ground (GND) depending upon the input control signals. Since the circuit is a feedback circuit, Capacitor C1 is acting as a compensation capacitor to ensure the stability of the system.

Conventionally, in a DAC, the output voltage is proportional to the data code at the input, but an increase in the voltage across the output load for a data code of high value may eventually push the switch into a linear mode from a saturation mode, thereby degrading the output impedance (Zout) and bringing down the Total Harmonic Distortion (THD) to a low level. Moreover, in nano/micro dimension integrated chips, it may become even more difficult to keep the source and the cascode in saturation mode due to reduction in supply voltages because of reduced size.

Further, due to supply limitation switch sizes becoming large, which again decreases the Zout due to increased parasitic capacitance and thereby reducing THD, a current source M1 along with active cascode stage M2, M5 and M6 may be used with a very small series switch M3 and M4 with the purpose to achieve high output impedance and thus the high THD. However, when the sizes of the switches M3 and M4 are reduced, the voltage drop across the switch may become significant and impact the circuit. The switch M3 may be generally in the saturation mode at low output voltage (Lower Data Code), and may be in a linear mode at higher output voltages (Higher Data Code). This may create a capacitance variation at the output as the drain-source resistance Rds of the switch M3 decreases when it is in the linear mode, making the capacitance of the drain of M2 visible at the output. As the switch M3 is in series with the cascade so in order to achieve a cascade in saturation mode, it may become necessary to increase the size of the cascade, which makes the variation of capacitance even larger, thereby degrading the linearity of the DAC. Furthermore, due to dynamic range limitation, it may become difficult to implement multiple cascades.

SUMMARY OF THE INVENTION

The present disclosure describes a current-steering digital-to-analog converter that may comprise plurality of current cells. Each current cell may comprise a dual bias switched cascode output current source/sink, a bias source, complementary bias switching elements coupled between the bias source and the bias inputs of the switched cascode output current source/sink, and complementary switching signals coupled to the control inputs of the complementary bias switching element.

According to an embodiment of the present disclosure, an integrated circuit may comprise a current-steering digital-to-analog converter that may comprise a plurality of current cells, each current cell may comprise a dual bias switched cascode output current source/sink, a bias source, complementary bias switching elements coupled between the bias source and the bias inputs of the switched cascode output current source/sink, and complementary switching signals coupled to the control inputs of the complementary bias switching element.

According to an embodiment of the present disclosure, a method of providing current-steering digital-to-analog conversion may comprise providing a bias voltage. The method may further comprise providing a dual bias voltage switched cascode output current source/sink, and selectively coupling the bias voltage to one of the dual bias input of the switched cascode output current source/sink while disabling the bias to the other bias input.

BRIEF DESCRIPTION OF THE DRAWINGS

The present disclosure explains the various embodiments of the present disclosure in the following description, taken in conjunction with the accompanying drawings, wherein.

DETAILED DESCRIPTION OF THE PREFERRED EMBODIMENT

Figure 1:
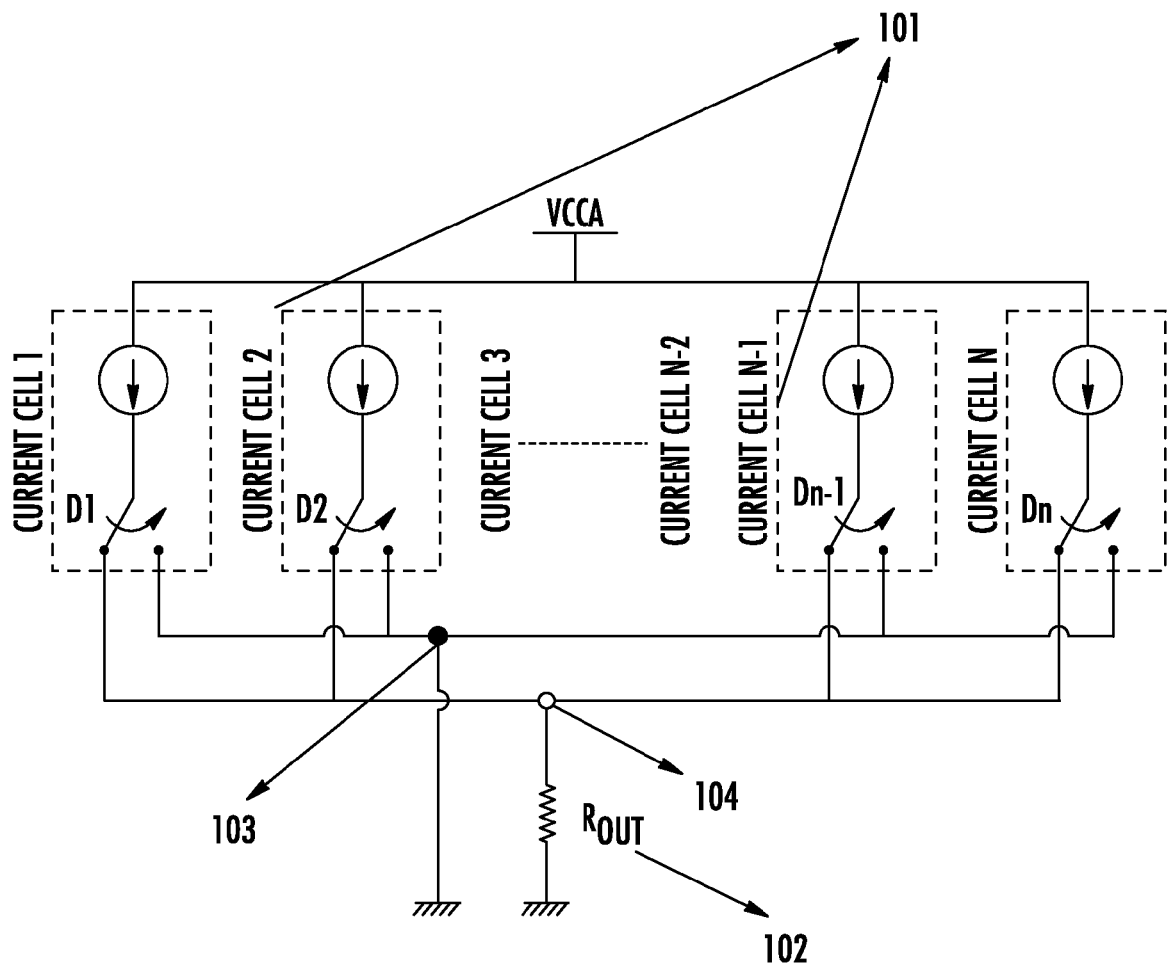
FIG. 1 is a circuit diagram of a current-steering DAC with current source, according to the prior art.
Figure 2:
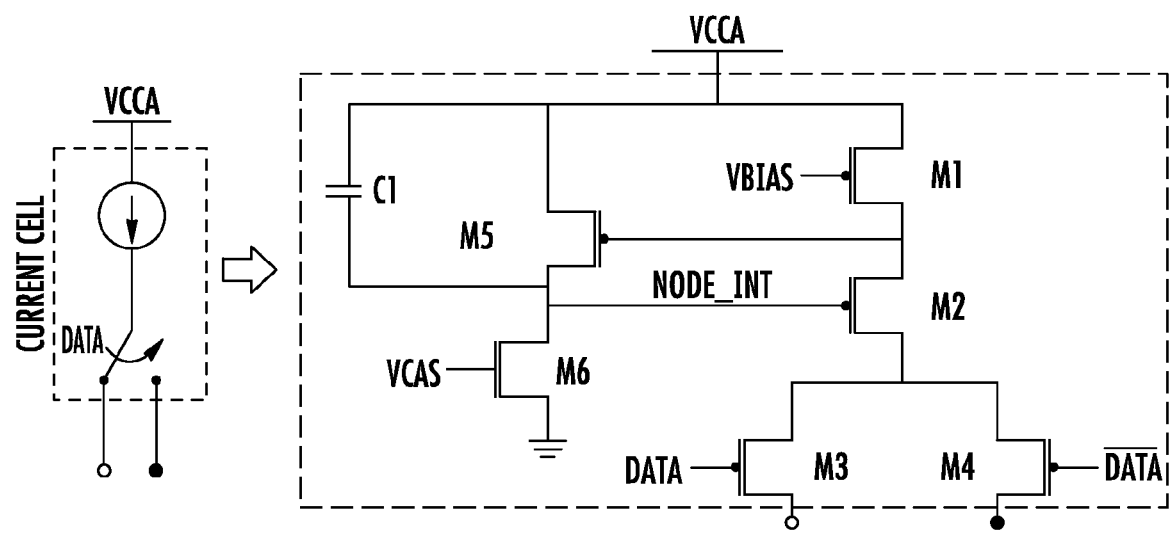
FIG. 2 is a circuit diagram of a unit current cell of the current-steering DAC, according to the prior art.

While the disclosure may be described in conjunction with the illustrated embodiment, it may be understood that it is not intended to limit the disclosure to such embodiment. On the contrary, it is intended to cover all alternatives, modifications, and equivalents as may be included within the spirit and scope of the disclosure as defined by the appended claims.

The embodiments of the present disclosure may now be described in detail with reference to the accompanying drawings. However, the present disclosure is not limited to the embodiments. The present disclosure can be modified in various forms. Thus, the embodiments of the present disclosure are only provided to explain more clearly the present disclosure to the ordinarily skilled in the art of the present disclosure. In the accompanying drawings, like reference numerals are used to indicate like components.

Figure 3:
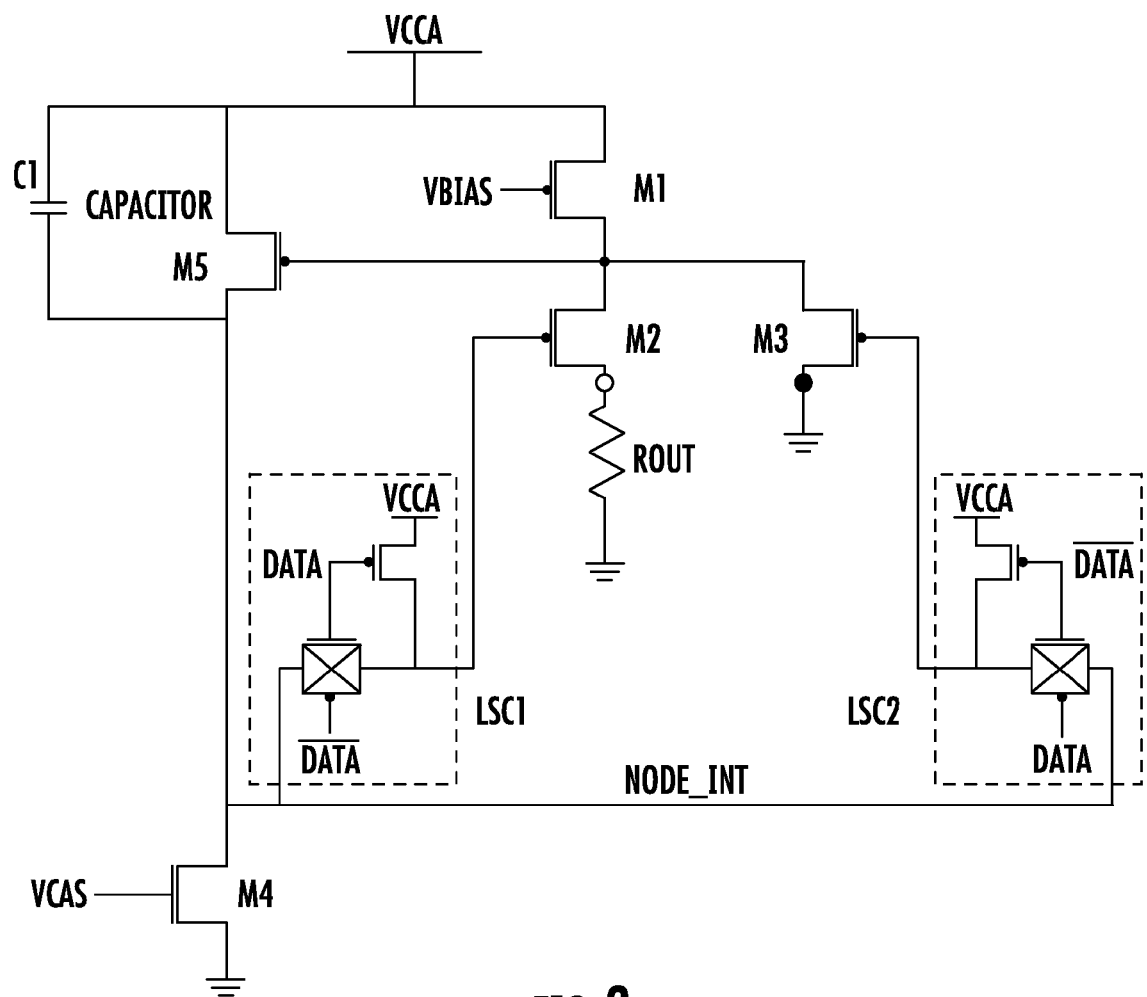
FIG. 3 is a circuit diagram of a unit current cell using loop switching technique, according to the present disclosure.

FIG. 3 illustrates an internal architecture of a unit current cell using loop switching technique according to the present disclosure. The present architecture comprises M1 acting as a current source, and M2, M3, M4 acting as a dual bias switched cascode output current source or sink with complementary bias switching elements LSC1 and LSC2, which are controlled by complementary control signals. This architecture uses one bias switching element while the other is inactive. Further, the complementary bias switching element LSC1 comprises a transmission gate or an analog multiplexer coupled to a pull-up transistor and connected with M2, M4, and M5 forming a first loop switching architecture. Similarly, the complementary bias switching element LSC2 comprises a transmission gate or an analog multiplexer coupled to a pull-up transistor and to M3, M4, and M5, forming a second loop switching architecture. Further, according this architecture, the voltage drop across the switch is saved and this voltage is utilized to reduce the size of the cascade, which in turn helps increase the output impedance reducing the output capacitance.

Alternatively, this voltage is used to increase the output voltage of the DAC. M2 and M3 either play the role of a cascode (in saturation mode) in active/closed loop or a switch (in sub-threshold mode) in an inactive/open loop. However, there is no significant change in output impedance. During the operation, switching of LSC1 and LSC2 causes a variation of voltage at the bias source node_int, due to the charge sharing. But for better performance of the circuit, this node should be very stable.

Assuming the loop including M2 and LSC1 is inactive, the gate node of M3 is charged to $V_{CCA}$, and the charge stored across the effective capacitance Ceff at the gate of the M3 with respect to $V_{CCA}$ is 0. The charge stored in the capacitor C1, which is connected across "node_int" and $V_{CCA}$ with respect to $V_{CCA}$ is $((V(V_{CCA})-V(node\_int))\times C(C1))$. If control signal toggles, then the loop having M3 and LSC2 becomes active. Accordingly, the charge sharing, which happens between the capacitor C1 and Ceff, is approximated as follows:

Vds of M5=$(V(VCCA)-V(node\_int))$=(total charge across Ceff+total charge across C1)/(total capacitance) $(V(VCCA)-V(node\_int))$=(0+$((V(VCCA)-V(node\_int))\times C(C1))$")/(Ceff+$C(C1)$)

Although the charge is 0 in Ceff, the value of effective capacitance Ceff is not 0. However, this allows a decrease in the Vds voltage of M5, which results in increasing the voltage at the node_int. Further, this problem is addressed in the following ways: firstly, current through M4 is increased, so that the charge accumulated can be drained faster. Secondly, the value of capacitor C1 is increased, so that the percentage voltage variation can be minimized. This has to be done judiciously taking into consideration the loop bandwidth, system bandwidth, area etc. Similarly the loops are switched back and forth to complete the cycle of the DAC. The architecture according to the present disclosure increase the linearity of the DAC as it increases the output impedance due to the reduced size of switched cascode and also reduces the variation of impedance across the entire output voltage range.

Figure 4:
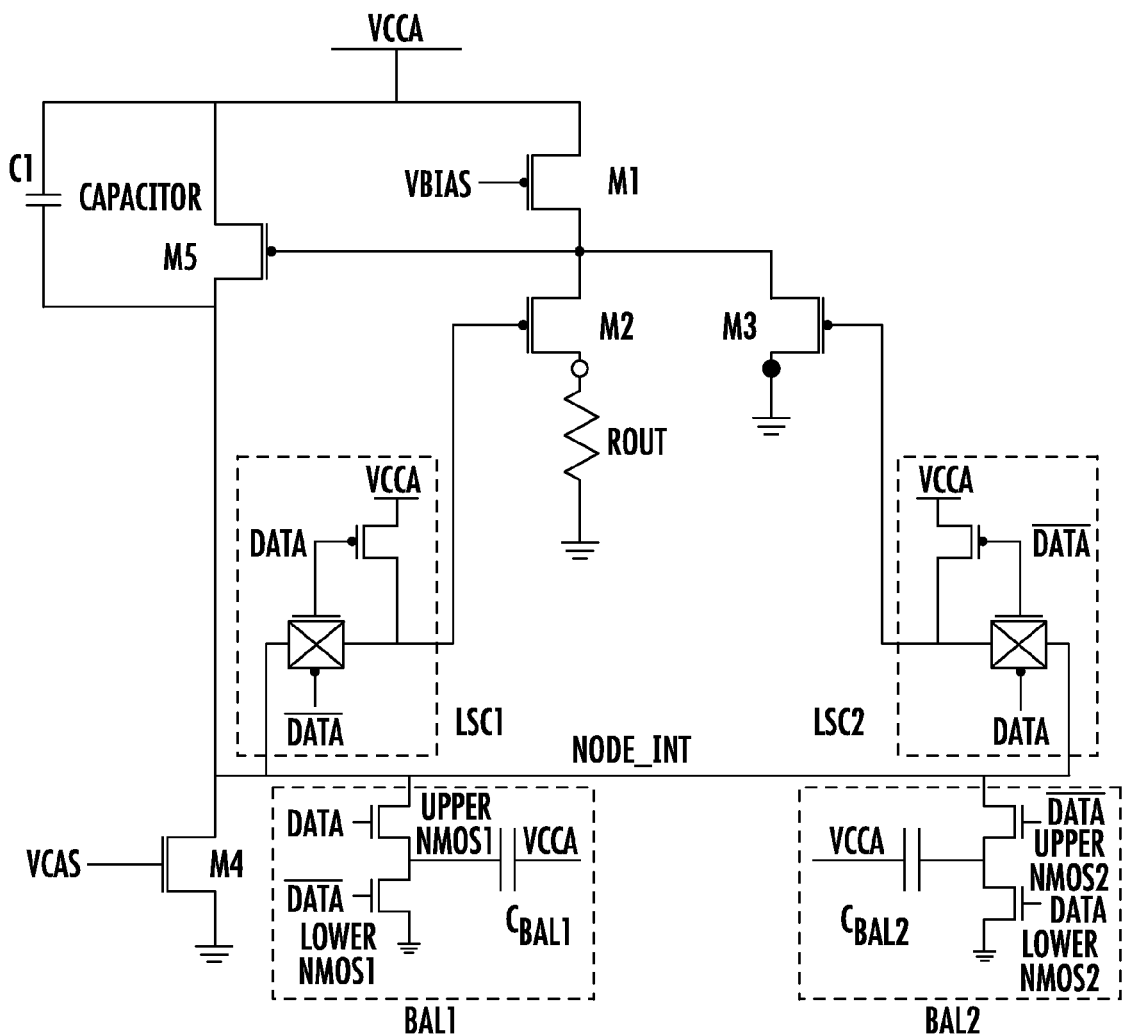
FIG. 4 is a circuit diagram of a unit current cell using loop switching technique along with a charge balancing mechanism, according to the present disclosure.

FIG. 4 illustrates an internal architecture of a unit current cell using loop switching technique along with a charge balancing mechanism according to the present disclosure. It can be used where linearity of the system are more rigid such as high end HDTV (High Definition Television), Telecommunication etc. Referring to FIG. 3, two charge balancing circuits BAL1 and BAL2 are combined with the complementary switching elements LSC1 and LSC2 respectively. Each balancing circuit includes two NMOS transistors with a capacitor connected in between them. As previously mentioned in FIG. 3, LSC1 and LSC2 are controlled by complementary control signals.

During the operation, only one loop is active at a time and depending upon the control signal, there is only one way for the current to flow, either through M2 or M3 depending upon the loop which is active. So, M2 and M3 either play the role of a cascode (in saturation mode) in active loop or a switch (in sub-threshold mode) in an inactive loop. In this case, either M2 or M3 is pulled to $V_{CCA}$ (supply Voltage). Assuming, the loop having M2 and LSC1 is inactive. So it implies that the gate node of M2 is charged to $V_{CCA}$, the charge stored across the effective capacitance (Ceff) at the gate of the M2 with respect to $V_{CCA}$ is 0. Since the loop is off, the capacitor (Cbal1) of the corresponding balancing circuit (BAL1) is connected to GNDA through the lower NMOS1. As the other end of the capacitor (Cbal1) is connected to $V_{CCA}$, then the charge on the capacitor is a charge of "$V(V_{CCA})\times C(Cbal1)$" with respect to $V_{CCA}$. The charge stored in the capacitor (C1), which is connected across node_int and $V_{CCA}$, with respect to $V_{CCA}$ is $((V(V_{CCA})-V(node\_int))\times C(C1))$.

When the control signal toggles, loop having M2 and LSC1 becomes active, and the gate of M3 is pulled to $V_{CCA}$ making the complementary loop inactive. Hence, a charge sharing happens between the capacitors C1, Ceff, and Cbal1. So the instantaneous voltage at "node_int" with respect to VCCA is approximated by:

Vds of M5=$(V(VCCA)-V(node\_int))$ after control signal toggles=(total charge across Ceff+total charge across C1+total charge across $Cbal1$)/(total capacitance) $(V(VCCA)-V(node\_int))$=(0+$((V(VCCA)-V(node\_int))\times C(C1))+V(VCCA)\times C(Cbal1))$/(Ceff+$C(C1)+C(Cbal1)$)     eqn (1)

Initial value of V(node_int) with respect to VCCA (before control signal toggles)=$V(VCCA)-V(node\_int))\times(Ceff+C(C1)+Cbal2)/(Ceff+C(C1)+Cbal2)$     eqn (2)

Further, to minimize the glitch, the initial value of voltage across "node_int" before data toggles may be same as the value of voltage across "node_int" after the control signal toggles. Hence, eqn (1)=eqn (2).

$$(V(VCCA)-V(\text{node\_int})) \text{ with respect to } VCCA \text{ (before control signal toggles)}=(0+((V(VCCA)-V(\text{node\_int}))\times C(C1))+V(VCCA)\times C(Cbal1))/(\text{Ceff}+C(C1)+C(Cbal1))$$

After simplifying, $$C(Cbal1)/\text{Ceff}=(V(VCCA)-V(\text{node\_int}))/V(\text{node\_int})$$

where, Cbal2 is same as Cbal1.

Similarly, the loops are switched back and forth to complete the cycle the DAC. The cycle of charge balancing is continued on every change of control signal, which occurs on the single cell of the DAC. This modification improves the speed of the circuit by making the circuit execute faster, reduces the value of Capacitor C1 and the current through M5, reduces the glitch which is passed to the drain of the source transistor due to switching, reduces the capacitance requirement across NMOS current sink M4 by dynamically balancing the charge, and reduces the current through NMOS current sink M4 by draining out the differential charge. Further, the glitch which passes to the drain of current source M1 is also reduced as the charge which imbalances the circuit is balanced almost instantly. Furthermore, the feedback loop settles faster due to charge cancellation that happens due to the charge balancing circuit, hence the response at high frequencies of the circuit is improved and so is the dynamic response.

Figure 5:
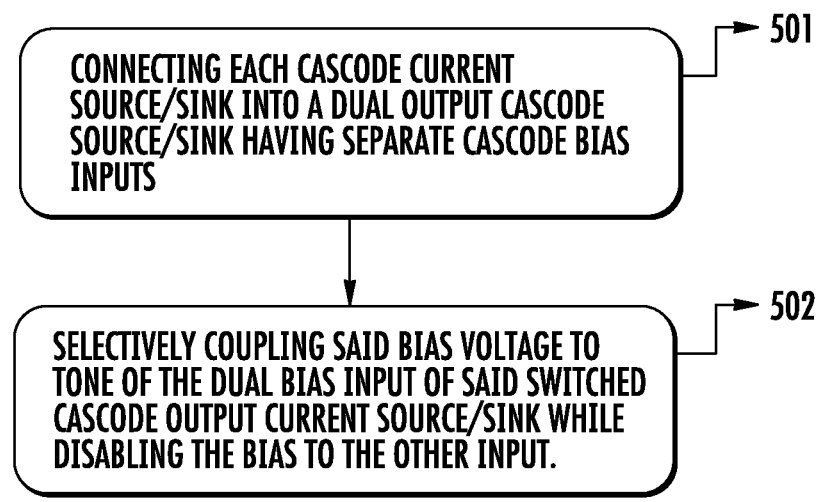
FIG. 5 is a flow chart for a method of providing current-steering digital-to-analog conversion, according to the present disclosure.

Embodiments of the method for providing current-steering digital-to-analog conversion are described in FIG. 5. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 5 illustrates a flow chart for a method of providing current-steering digital-to-analog conversion according to the present disclosure. Step 501 comprises connecting each cascode current source/sink into a dual output cascade source/sink having separate cascade bias inputs, and step 502 selectively couples the bias voltage to one of the dual bias input of the switched cascade output current source/sink while disabling the bias to the other bias input. Further, the method also provides a charge balancing at the bias node whenever it is switched from one bias input to another by coupling a compensating charge storage element to the bias node.

The present disclosure is applicable to all types of on-chip and off chip digital-to analog converters used in various in digital electronic circuitry, or in hardware, firmware, or in computer hardware, firmware, software, or in combination thereof. The present disclosure can be implemented advantageously on a programmable system including at least one input device, and at least one output device. Each computer program can be implemented in a high-level procedural or object-oriented programming language or in assembly or machine language, if desired; and in any case, the language can be a compiled or interpreted language. It can be also applicable to all types of general and specific microprocessors.

It may be apparent to those having ordinary skill in this art that various modifications and variations may be made to the embodiments disclosed herein, consistent with the present disclosure, without departing from the spirit and scope of the present disclosure. Other embodiments consistent with the present disclosure may become apparent from consideration of the specification and the practice of the devices and methods disclosed herein.

That which is claimed:

1. A current-steering digital-to-analog converter (DAC) comprising:
   a plurality of current cells, each current cell comprising
      a dual bias switched cascode output current source having a plurality of control terminals configured to define bias inputs, and
      a pair of complementary bias switching devices coupled between a reference voltage and the bias inputs of said dual bias switched cascode output current source,
      each complementary bias switching device including a control input configured to receive a respective complementary switching signal.

2. The current-steering DAC of claim 1 wherein each complementary bias switching device comprises a multiplexer.

3. The current-steering DAC of claim 1 wherein each complementary bias switching device comprises a transmission gate.

4. The current-steering DAC of claim 1 wherein each complementary bias switching device comprises a charge balancing device.

5. The current-steering DAC of claim 4 wherein said charge balancing device comprises an electronic switch, and a charge storage device coupled thereto.

6. The current-steering DAC of claim 5 wherein said charge storage device comprises a capacitor.

7. An integrated circuit (IC) comprising:
   a plurality of current cells configured to define a current-steering digital-to-analog converter (DAC), each current cell comprising
      a dual bias switched cascode output current source having a plurality of control terminals configured to define bias inputs, and
      a pair of complementary bias switching devices coupled between a reference voltage and the bias inputs of said dual bias switched cascode output current source,
      each complementary bias switching device including a control input configured to receive a respective complementary switching signal.

8. The IC of claim 7 wherein each complementary bias switching device comprises a transmission gate.

9. The IC of claim 7 wherein each complementary bias switching device comprises a multiplexer.

10. The IC of claim 7 wherein each complementary bias switching device comprises a charge balancing device.

11. The IC of claim 10 wherein said charge balancing device comprises an electronic switch, and a charge storage device coupled thereto.

12. The IC of claim 11 wherein said charge storage device comprises a capacitor.

13. A current cell for a current-steering digital-to-analog converter (DAC), the current cell comprising:
   a dual bias switched cascode output current source having a plurality of control terminals configured to define bias inputs; and
   a pair of complementary bias switching devices coupled between a reference voltage and the bias inputs of said dual bias switched cascode output current source;
   each complementary bias switching device including a control input configured to receive a respective complementary switching signal.

14. The current cell of claim 13 wherein each complementary bias switching device comprises a multiplexer.

15. The current cell of claim 13 wherein each complementary bias switching device comprises a transmission gate.

16. The current cell of claim 13 wherein each complementary bias switching device comprises a charge balancing device.

17. The current cell of claim 16 wherein said charge balancing device comprises an electronic switch, and a charge storage device coupled thereto.

18. The current cell of claim 17 wherein said charge storage device comprises a capacitor.

19. A method of operating a digital-to-analog converter (DAC) using a plurality of current-steering cascode current sources, the method comprising:
   connecting each current-steering cascode current source into a dual output cascode source having a pair of control terminals defining cascode bias inputs; and
   selectively coupling a cascode bias voltage to one of the cascode bias inputs of the dual output cascode source while disabling a bias to the other cascode bias input using a plurality of complementary bias switching devices coupled between a reference voltage and the cascode bias inputs.

20. The method of claim 19 further comprising charge balancing at a cascode bias node during switching of the cascode bias voltage from one cascode bias input to another.

21. The method of claim 20 wherein the charge balancing is provided at the cascode bias node by coupling a compensating charge storage element to the bias node.

22. A method of making a current-steering digital-to-analog converter (DAC), the method comprising:
   coupling a plurality of current cells to each other, each current cell comprising
      a dual bias switched cascode output current source having a plurality of control terminals defining bias inputs, and
      a pair of complementary bias switching devices coupled between a reference voltage and the bias inputs of the dual bias switched cascode output current source,
      each complementary bias switching device including a control input configured to receive a respective complementary switching signal.

23. The method of claim 22 wherein each complementary bias switching device comprises a multiplexer.

24. The method of claim 22 wherein each complementary bias switching device comprises a transmission gate.

25. The method of claim 22 wherein each complementary bias switching device comprises a charge balancing device.

26. The method of claim 25 wherein the charge balancing device comprises an electronic switch, and a charge storage device coupled thereto.

27. The method of claim 26 wherein the charge storage device comprises a capacitor.

* * * * *